US010121550B2

(12) United States Patent
Huang et al.

(10) Patent No.: US 10,121,550 B2
(45) Date of Patent: Nov. 6, 2018

(54) POWER SWITCH CIRCUIT

(71) Applicant: eMemory Technology Inc., Hsin-Chu (TW)

(72) Inventors: Chih-Yang Huang, Tainan (TW); Wei-Ming Ku, New Taipei (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 0 days.

(21) Appl. No.: 15/397,043

(22) Filed: Jan. 3, 2017

(65) Prior Publication Data

US 2017/0206976 A1 Jul. 20, 2017

Related U.S. Application Data

(60) Provisional application No. 62/280,683, filed on Jan. 19, 2016.

(51) Int. Cl.
*H03L 5/00* (2006.01)
*G11C 16/30* (2006.01)

(52) U.S. Cl.
CPC .................................... *G11C 16/30* (2013.01)

(58) Field of Classification Search
None
See application file for complete search history.

(56) References Cited

U.S. PATENT DOCUMENTS 6,621,745 B1 * 9/2003 Manea ..................... G11C 8/08 365/185.22
6,774,704 B2 8/2004 Kushnarenko
7,081,774 B2 * 7/2006 Miyake .................... G09G 3/20 326/82
7,288,964 B2 10/2007 Ku et al.
8,022,574 B2 9/2011 Ryoo
(Continued)

FOREIGN PATENT DOCUMENTS

JP H07321293 12/1995
JP H0870246 3/1996
(Continued)

OTHER PUBLICATIONS

European Patent Office , "Office Action", dated Jun. 16, 2017.
(Continued)

*Primary Examiner* — Lincoln Donovan
*Assistant Examiner* — Khareem E Almo
(74) *Attorney, Agent, or Firm* — WPAT, PC

(57) ABSTRACT

A power switch circuit includes a first transistor, a second transistor and a current source. A first source/drain terminal and a gate terminal of the first transistor receive a first supply voltage and a second supply voltage, respectively. A second source/drain terminal and a body terminal of the first transistor are connected with a node z. An output signal is outputted from the node z. A first source/drain terminal and a gate terminal of the second transistor receive the second supply voltage and the first supply voltage, respectively. A second source/drain terminal and a body terminal of the second transistor are connected with the node z. The current source is connected between a bias voltage and the node z. The first supply voltage, the second supply voltage or the bias voltage is selected as the output signal.

14 Claims, 10 Drawing Sheets

(56) References Cited

U.S. PATENT DOCUMENTS

| | | | | |
|---|---|---|---|---|
| 8,044,699 | B1 * | 10/2011 | Kelly | H03K 19/017536 327/333 |
| 8,258,853 | B2 * | 9/2012 | Ku | H03K 3/356113 327/407 |
| 8,779,842 | B2 | 7/2014 | Lee | |
| 9,130,553 | B2 | 9/2015 | Huisman et al. | |
| 9,165,661 | B2 * | 10/2015 | Amonkar | G11C 16/12 |
| 2006/0097773 | A1 * | 5/2006 | Kang | H02M 3/07 327/536 |
| 2007/0035181 | A1 | 2/2007 | Ku et al. | |
| 2010/0246750 | A1 * | 9/2010 | Kimura | G09G 3/3677 377/64 |
| 2014/0043091 | A1 * | 2/2014 | Lee | H03K 17/6872 327/408 |
| 2014/0062204 | A1 | 3/2014 | Kim | |
| 2014/0307513 | A1 * | 10/2014 | Chun | G11C 5/146 365/189.09 |
| 2015/0263175 | A1 * | 9/2015 | Koyama | H01L 29/7869 365/189.09 |
| 2016/0180923 | A1 | 6/2016 | Kamohara et al. | |
| 2017/0154672 | A1 | 6/2017 | Menezes | |
| 2017/0206976 | A1 | 7/2017 | Huang et al. | |
| 2018/0068713 | A1 | 3/2018 | Deng et al. | |

FOREIGN PATENT DOCUMENTS

| | | |
|---|---|---|
| JP | 20020505496 | 2/2002 |
| JP | 2008010940 | 1/2008 |
| WO | WO2014038115 | 3/2014 |

OTHER PUBLICATIONS

Japan Patent Office, “Office Action” dated Jan. 30, 2018.

Taiwan Intellectual Property Office, “Office Action” dated Oct. 5, 2017, Taiwan.

Japan Patent Office, “Office Action”, dated Jul. 31, 2018.

* cited by examiner

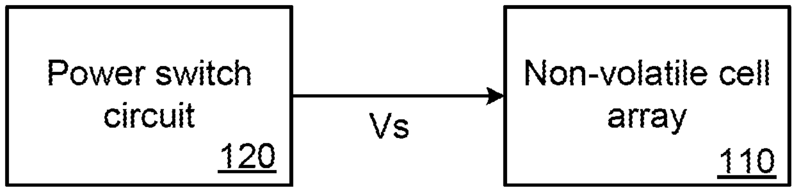
FIG. 1 (PRIOR ART)
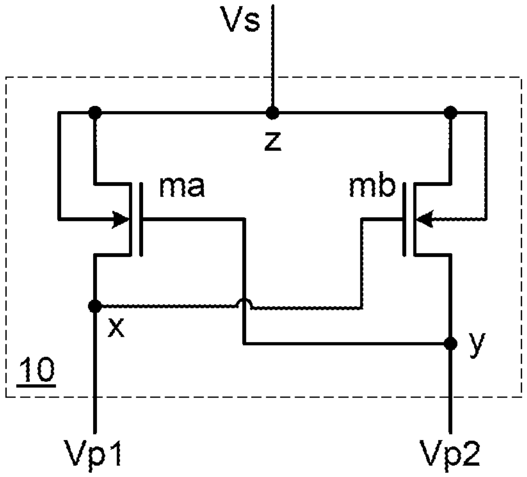
FIG. 2A
| | | | | |
|---|---|---|---|---|
| Vp1 | 0V | -6V | 0V | 0V |
| Vp2 | -4V | -4V | 0V | floating |
| Vs | -4V | -6V | 0-Vtn (floating) | 0-Vtn (floating) |
FIG. 2B

| | | | | |
|---|---|---|---|---|
| Vp1 | 0V | -6V | 0V | 0V |
| Vp2 | -4V | -4V | 0V | floating |
| EN_mc | Lo | Lo | Hi | Hi |
| Sc | -4V | -6V | 3.3V | 3.3V |
| Vs | -4V | -6V | Vbias | Vbias |

| | | | | |
|---|---|---|---|---|
| Vp1 | 0V | -6V | 0V | 0V |
| Vp2 | -4V | -4V | 0V | floating |
| Vs | -4V | -6V | Vbias | Vbias |

| | EN_m1= "Hi" EN_m2="Lo" | EN_m1= "Lo" EN_m2="Hi" | EN_m1= "Hi" EN_m2="Lo" | EN_m1= "Lo" EN_m2="Hi" |
|---|---|---|---|---|
| Vp1 | -4V | -4V | -4V | -4V |
| Vp2 | 0V | 0V | -6V | -6V |
| Vx | -4V | -4V | -6V | -6V |
| S1 | 3.3V | -4V | 3.3V | -6V |
| S2 | -4V | 3.3V | -6V | 3.3V |
| Vs | -4V | 0V | -4V | -6V |

POWER SWITCH CIRCUIT

This application claims the benefit of U.S. provisional application Ser. No. 62/280,683, filed Jan. 19, 2016, the disclosure of which is incorporated by reference herein in its entirety.

FIELD OF THE INVENTION

The present invention relates to a power switch circuit, and more particularly to a power switch circuit for a non-volatile memory.

BACKGROUND OF THE INVENTION

As is well known, a non-volatile memory is able to continuously retain data after the supplied power is interrupted. Consequently, the non-volatile memory is widely used in a variety of electronic products. Generally, the non-volatile memory comprises a non-volatile cell array. The memory array consists of plural non-volatile cells. In addition, each non-volatile cell has a floating gate transistor.

FIG. 1 schematically illustrates the architecture of a non-volatile memory. As shown in FIG. 1, the non-volatile memory comprises a non-volatile cell array 110 and a power switch circuit 120. The power switch circuit 120 is connected with the non-volatile cell array 110. The power switch circuit 120 receives plural supply voltages. In addition, the power switch circuit 120 provides a proper supply voltage (i.e., an output signal Vs) to the non-volatile cell array 110 in different operation modes.

For example, the power switch circuit 120 receives a first supply voltage and a second supply voltage. In an erase mode, the power switch circuit 120 provides the first supply voltage to the non-volatile cell array 110. In a program mode, the power switch circuit 120 provides the second supply voltage to the non-volatile cell array 110.

SUMMARY OF THE INVENTION

An embodiment of the present invention provides a power switch circuit. The power switch circuit includes a first transistor, a second transistor and a current source. A first source/drain terminal of the first transistor receives a first supply voltage. A second source/drain terminal of the first transistor is connected with a node z. A gate terminal of the first transistor receives a second supply voltage. A body terminal of the first transistor is connected with the node z. An output signal is outputted from the node z. A first source/drain terminal of the second transistor receives the second supply voltage. A second source/drain terminal of the second transistor is connected with the node z. A gate terminal of the second transistor receives the first supply voltage. A body terminal of the second transistor is connected with the node z. The current source is connected between a bias voltage and the node z. If the first supply voltage is lower than the second supply voltage, the first supply voltage is selected as the output signal. If the first supply voltage is higher than the second supply voltage, the second supply voltage is selected as the output signal. If the first supply voltage is equal to the second supply voltage, the bias voltage is selected as the output signal.

Another embodiment of the present invention provides a power switch circuit. The power switch circuit includes a first transistor, a second transistor, a third transistor, an automatic selection circuit and a level shifter. A first source/drain terminal of the first transistor receives a first supply voltage. A second source/drain terminal of the first transistor is connected with a node z. A gate terminal of the first transistor receives a second supply voltage. A body terminal of the first transistor is connected with the node z. An output signal is outputted from the node z. A first source/drain terminal of the second transistor receives the second supply voltage. A second source/drain terminal of the second transistor is connected with the node z. A gate terminal of the second transistor receives the first supply voltage. A body terminal of the second transistor is connected with the node z. A first source/drain terminal of the third transistor receives a bias voltage. A second source/drain terminal of the third transistor is connected with the node z. A gate terminal of the third transistor receives a shifted signal. A body terminal of the third transistor is connected with the node z. The automatic selection circuit receives the first supply voltage and the second supply voltage and generates an output voltage. If the first supply voltage is lower than the second supply voltage, the first supply voltage is selected as the output voltage. If the first supply voltage is higher than the second supply voltage, the second supply voltage is selected as the output voltage. The level shifter is used for converting a control signal into the shifted signal according to the control signal and the output voltage.

A further embodiment of the present invention provides a power switch circuit. The power switch circuit includes a first transistor, a second transistor, a first automatic selection circuit, a first level shifter and a second level shifter. A first source/drain terminal of the first transistor receives a first supply voltage. A second source/drain terminal of the first transistor is connected with a node w. A gate terminal of the first transistor receives a first shifted signal. An output signal is outputted from the node w. A first source/drain terminal of the second transistor receives the second supply voltage. A second source/drain terminal of the second transistor is connected with the node w. A gate terminal of the second transistor receives a second shifted signal. The first automatic selection circuit receives the first supply voltage and the second supply voltage and generates an output voltage. If the first supply voltage is lower than the second supply voltage, the first supply voltage is selected as the output voltage. If the first supply voltage is higher than the second supply voltage, the second supply voltage is selected as the output voltage. The first level shifter is used for converting a first control signal into the first shifted signal according to the first control signal and the output voltage. The second level shifter is used for converting a second control signal into the second shifted signal according to the second control signal and the output voltage.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 1 (prior art) schematically illustrates the architecture of a non-volatile memory;

FIG. 2A is a schematic circuit diagram of an automatic selection circuit;

FIG. 2B is a truth table illustrating the voltage levels of associated signals of the automatic selection circuit of FIG. 2A;

DETAILED DESCRIPTION OF PREFERRED EMBODIMENTS

Figures 3A, 3B:
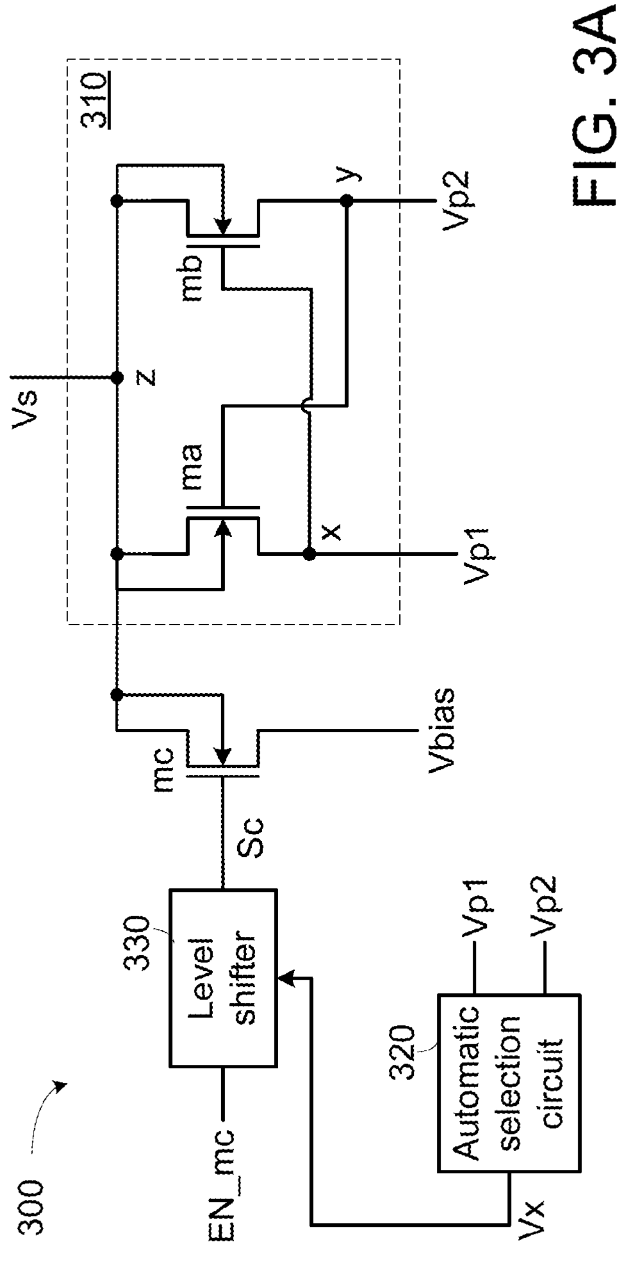
FIG. 3A is a schematic circuit diagram illustrating a power switch circuit according to a first embodiment of the present invention.
FIG. 3B is a truth table illustrating the voltage levels of associated signals of the power switch circuit of FIG. 3A.

FIG. 2A is a schematic circuit diagram of an automatic selection circuit. As shown in FIG. 2A, the automatic selection circuit 10 comprises two n-type transistors ma and mb. A first source/drain terminal of the transistor ma is connected with a node x. A second source/drain terminal of the transistor ma is connected with a node z. A gate terminal of the transistor ma is connected with a node y. A body terminal of the transistor ma is connected with the node z. A first source/drain terminal of the transistor mb is connected with the node y. A second source/drain terminal of the transistor mb is connected with the node z. A gate terminal of the transistor mb is connected with the node x. A body terminal of the transistor mb is connected with the node z. The node x and the node y are two input terminals of the automatic selection circuit 10. Moreover, the node x and the node y receive the supply voltages Vp1 and Vp2, respectively. The node z is an output terminal of the automatic selection circuit 10. One of the two supply voltages Vp1 and Vp2 is selected as an output signal Vs and outputted from the node z.

In an embodiment, the magnitudes of the supply voltages Vp1 and Vp2 are lower than or equal to 0V. Between the two supply voltages Vp1 and Vp2, the supply voltage with the lower magnitude is automatically selected as the output signal Vs by the automatic selection circuit 10. In another embodiment, the magnitudes of the supply voltages Vp1 and Vp2 are higher than 0V. Similarly, between the two supply voltages Vp1 and Vp2, the supply voltage with the lower magnitude is automatically selected as the output signal Vs by the automatic selection circuit 10.

FIG. 2B is a truth table illustrating the voltage levels of associated signals of the automatic selection circuit of FIG. 2A. If the supply voltage Vp1 is 0V and the supply voltage Vp2 is −4V, the transistor mb is turned on and the transistor ma is turned off. Since the supply voltage Vp2 has the lower magnitude (i.e., −4V), the supply voltage Vp2 is selected as the output signal Vs. If the supply voltage Vp1 is −6V and the supply voltage Vp2 is −4V, the transistor ma is turned on and the transistor mb is turned off. Since the supply voltage Vp1 has the lower magnitude (i.e., −6V), the supply voltage Vp1 is selected as the output signal Vs.

As mentioned above, the supply voltage with the lower magnitude is automatically selected as the output signal Vs by the automatic selection circuit 10. Furthermore, The lower magnitude of the output signal Vs is used as the body terminal voltage of the transistors ma and mb. In this way, the body effects of the transistors ma and mb can be eliminated.

Moreover, if the magnitudes of the supply voltages Vp1 and Vp2 are identical or one of the two supply voltages is not provided, the output signal Vs may be 0V or in a floating state. Under this circumstance, the magnitude of the output signal Vs is equal to the result of subtracting Vtn from the supply voltage, wherein Vtn is a threshold voltage of the transistors ma and mb.

Please refer to FIG. 2B. If both of the supply voltages Vp1 and Vp2 are 0V, the magnitude of the output signal Vs is equal to 0−Vtn. If the supply voltage Vp1 is 0V and the supply voltage Vp2 is not provided (i.e., the node y2 is in a floating state), the magnitude of the output signal Vs is equal to 0−Vtn.

FIG. 3A is a schematic circuit diagram illustrating a power switch circuit according to a first embodiment of the present invention. As shown in FIG. 3A, the power switch circuit 300 comprises two automatic selection circuits 310, 320, a level shifter 330 and an n-type transistor mc. The circuitry of the automatic selection circuit 310 and the circuitry of the automatic selection circuit 320 are identical to the circuitry of the automatic selection circuit of FIG. 2A.

The automatic selection circuit 310 receives two supply voltages Vp1 and Vp2. In addition, the supply voltage with the lower magnitude is automatically selected as an output signal Vs by the automatic selection circuit 310. The same, the automatic selection circuit 320 receives the two supply voltages Vp1 and Vp2. In addition, the supply voltage with the lower magnitude is automatically selected as an output voltage Vx by the automatic selection circuit 320. The output voltage Vx is used as a voltage source of the level shifter 330.

The level shifter 330 receives a control signal EN_mc. According to the voltage source Vx and the control signal EN_mc, the level shifter 330 is capable of shifting down the control signal EN_mc to a shifted signal Sc. For example, if the control signal EN_mc is in a high logic level state (e.g., 3.3V), the voltage level of the shifted signal Sc from the level shifter 330 is maintained at 3.3V. Whereas, if the control signal EN_mc is in a low logic level state (e.g., 0V), the voltage level of the shifted signal Sc from the level shifter 330 is shifted to the voltage level of the voltage source Vx.

In an embodiment, the control signal EN_mc is in the low logic level state when the magnitudes of the supply voltages Vp1 and Vp2 are different, the control signal EN_mc is in the high logic level state when the magnitudes of the supply voltages Vp1 and Vp2 are identical, and the control signal EN_mc is in the high logic level state when one of the supply voltages Vp1 and Vp2 is in a floating state.

A first source/drain terminal of the transistor mc is connected with a bias voltage Vbias. A second source/drain terminal and a body terminal of the transistor mc are connected with an output terminal of the power switch circuit 300 (i.e., the node z). The gate terminal of the transistor mc receives the shifted signal Sc. In an embodiment, the bias voltage Vbias is one of the supply voltages Vp1 and Vp2.

FIG. 3B is a truth table illustrating the voltage levels of associated signals of the power switch circuit of FIG. 3A. If the supply voltage Vp1 is 0V and the supply voltage Vp2 is −4V, the control signal EN_mc is in the low logic level state (Lo=0V) and the voltage level of the shifted signal Sc is −4V. Meanwhile, the transistor mc is turned off. Since the transistor mb is turned on and the transistor ma is turned off, the supply voltage Vp2 having the lower magnitude (i.e., −4V) is selected as the output signal Vs.

If the supply voltage Vp1 is −6V and the supply voltage Vp2 is −4V, the control signal EN_mc is in the low logic level state (Lo=0V) and the voltage level of the shifted signal Sc is −6V. Meanwhile, the transistor mc is turned off. Since the transistor ma is turned on and the transistor mb is turned off, the supply voltage Vp1 having the lower magnitude (i.e., −6V) is selected as the output signal Vs.

If the supply voltages Vp1 and Vp2 are identical, both of the transistors ma and mb are turned off. Since the control signal EN_mc is in the high logic level state (Hi=3.3V) and the voltage level of the shifted signal Sc is 3.3V, the transistor mc is turned on. Under this circumstance, the bias voltage Vbias is selected as the output signal Vs.

If the supply voltage Vp2 is in the floating state, both of the transistors ma and mb are turned off. Since the control signal EN_mc is in the high logic level state (Hi=3.3V) and the voltage level of the shifted signal Sc is 3.3V, the transistor mc is turned on. Under this circumstance, the bias voltage Vbias is selected as the output signal Vs. Moreover, the bias voltage Vbias is equal to one of the two supply voltages Vp1 and Vp2.

From the above descriptions, the power switch circuit 300 of this embodiment is capable of selecting the lower supply voltage as the output signal Vs and preventing the output signal Vs from being in the floating state when the supply voltage Vp1 is equal to the supply voltage Vp2.

Figure 4:
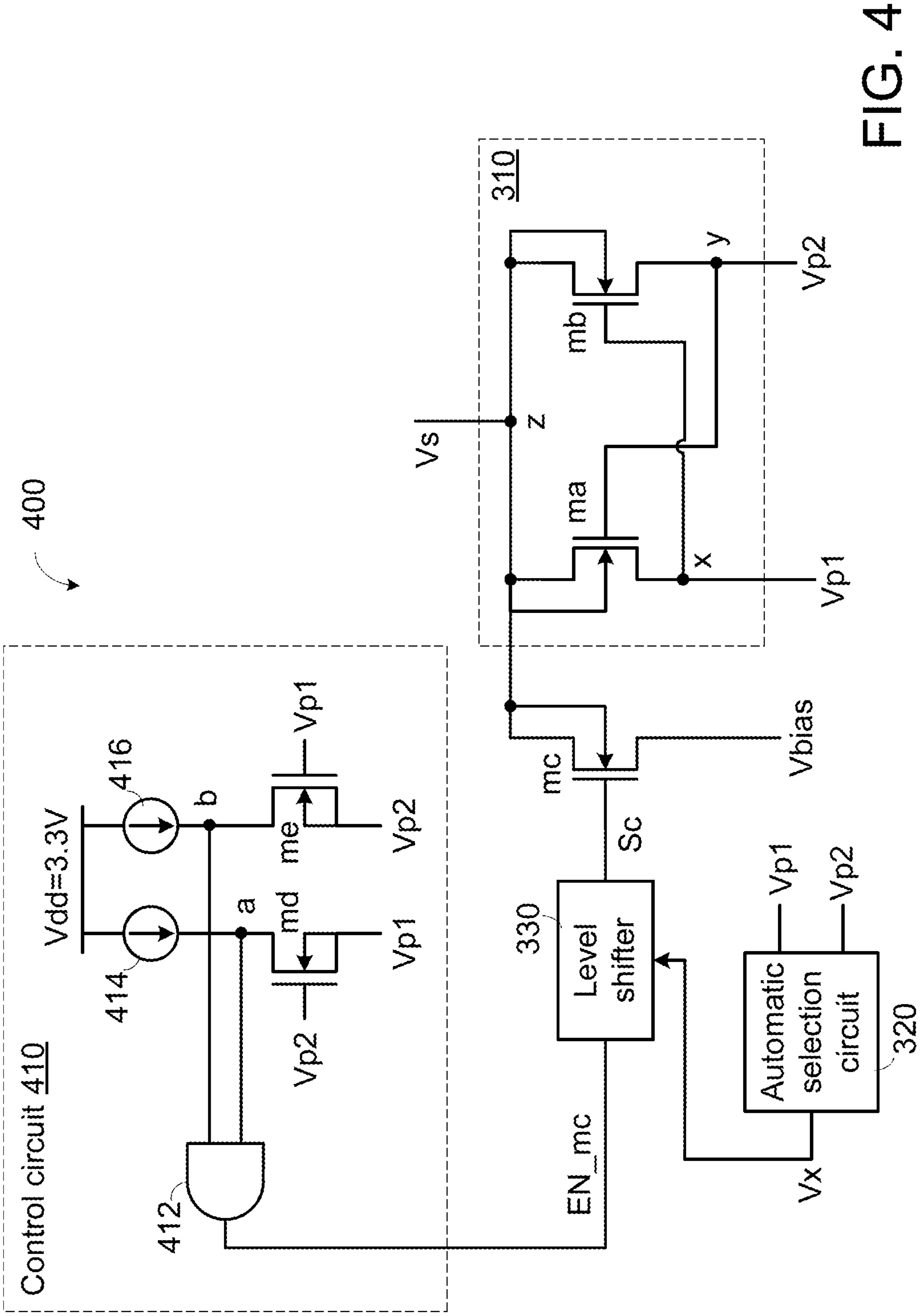
FIG. 4 is a schematic circuit diagram illustrating a power switch circuit according to a second embodiment of the present invention.

FIG. 4 is a schematic circuit diagram illustrating a power switch circuit according to a second embodiment of the present invention. In comparison with the power switch circuit 300 of FIG. 3A, the power switch circuit 400 further comprises a control circuit 410 for generating the control signal EN_mc.

As shown in FIG. 4, the control circuit 410 comprises transistors md, me, current sources 414, 416 and an AND gate 412. The current source 414 is connected between a voltage source Vdd and a node a. A first source/drain terminal and a body terminal of the transistor md receive the supply voltage Vp1. A second source/drain terminal of the transistor md is connected with the node a. A gate terminal of the transistor md receives the supply voltage Vp2. The current source 416 is connected between the voltage source Vdd and a node b. A first source/drain terminal and a body terminal of the transistor me receive the supply voltage Vp2. A second source/drain terminal of the transistor me is connected with the node b. A gate terminal of the transistor me receives the supply voltage Vp1. The two input terminals of the AND gate 412 are connected with the nodes a and b, respectively. The output terminal of the AND gate 412 generates the control signal EN_mc. In an embodiment, the voltage of the voltage source Vdd is 3.3V, and the bias voltage Vbias is equal to one of the two supply voltages Vp1 and Vp2.

If the magnitudes of the supply voltages Vp1 and Vp2 are different, one of the transistors md and me is turned on, and the other of the transistors md and me is turned off. For example, if the supply voltage Vp1 is 0V and the supply voltage Vp2 is −4V, the transistor me is turned on and the transistor md is turned off. Consequently, the node a is in the high logic level state, the node b is in the low logic level state, and the control signal EN_mc from the AND gate 412 is in the low logic level state.

If the supply voltages Vp1 and Vp2 are identical, both of the transistors md and me are turned off. For example, if the supply voltage Vp1 is 0V and the supply voltage Vp2 is 0V, both of the transistors md and me are turned off. Consequently, the node a and the node b are in the high logic level state, and the control signal EN_mc from the AND gate 412 is in the high logic level state.

If one of the supply voltages Vp1 and Vp2 is in the floating state, both of the transistors and me are turned off. Consequently, the control signal EN_mc from the AND gate 412 is in the high logic level state.

The truth table of the power switch circuit 400 is similar to that of FIG. 3B, and is not redundantly described herein. From the above descriptions, the power switch circuit 400 of this embodiment is capable of selecting the lower supply voltage as the output signal Vs and preventing the output signal Vs from being in the floating state when the supply voltage Vp1 is equal to the supply voltage Vp2.

Figures 5A, 5B:
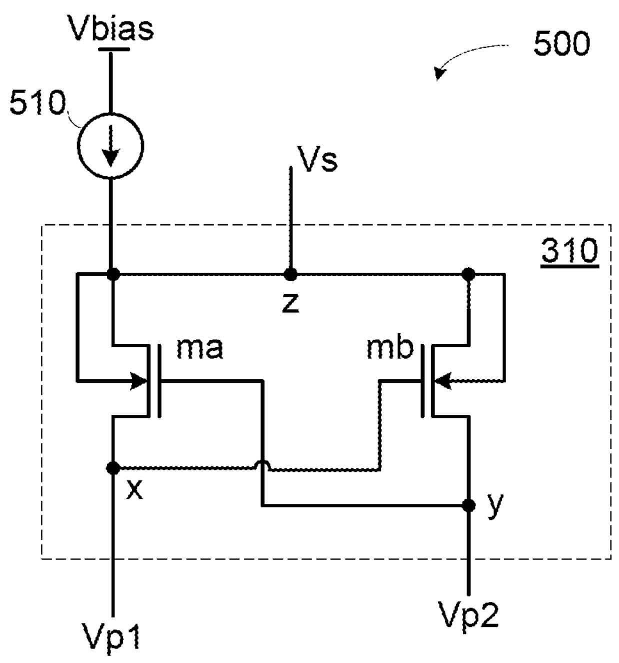
FIG. 5A is a schematic circuit diagram illustrating a power switch circuit according to a third embodiment of the present invention.
FIG. 5B is a truth table illustrating the voltage levels of associated signals of the power switch circuit of FIG. 5A.

FIG. 5A is a schematic circuit diagram illustrating a power switch circuit according to a third embodiment of the present invention. As shown in FIG. 5A, the power switch circuit 500 comprises an automatic selection circuit 310 and a weak current source 510. The circuitry of the automatic selection circuit 310 is identical to the circuitry of the automatic selection circuit of FIG. 2A. The weak current source 510 is connected between a bias voltage Vbias and an output terminal of the automatic selection circuit 310 (or a node z). Similarly, the power switch circuit 500 of this embodiment is capable of preventing the output signal Vs from being in the floating state when the supply voltage Vp1 is equal to the supply voltage Vp2.

FIG. 5B is a truth table illustrating the voltage levels of associated signals of the power switch circuit of FIG. 5A. If the supply voltage Vp1 is 0V and the supply voltage Vp2 is −4V, the transistor mb is turned on and the transistor ma is turned off. Consequently, the supply voltage Vp2 having the lower magnitude (i.e., −4V) is selected as the output signal Vs.

If the supply voltage Vp1 is −6V and the supply voltage Vp2 is −4V, the transistor ma is turned on and the transistor mb is turned off. Consequently, the supply voltage Vp1 having the lower magnitude (i.e., −6V) is selected as the output signal Vs.

If the magnitudes of the supply voltages Vp1 and Vp2 are identical or one of the two supply voltages is not provided, both of the transistors ma and mb are turned off. Meanwhile, the weak current provided by the weak current source 510 charges the node z. Consequently, the voltage of the node z is maintained at the bias voltage Vbias, and the node z is not in the floating state. Moreover, the bias voltage Vbias is equal to one of the two supply voltages Vp1 and Vp2.

From the above descriptions, the power switch circuit 500 of this embodiment is capable of selecting the lower supply voltage as the output signal Vs and preventing the output signal Vs from being in the floating state when the supply voltage Vp1 is equal to the supply voltage Vp2.

Figures 6A, 6B:
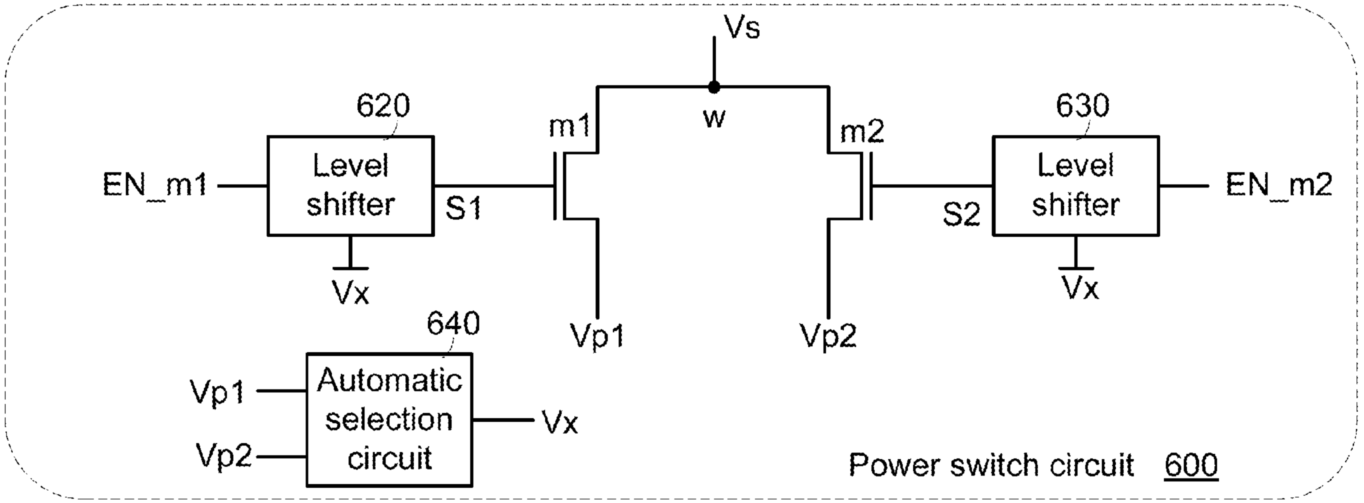
FIG. 6A is a schematic circuit diagram illustrating a power switch circuit according to a fourth embodiment of the present invention.
FIG. 6B is a truth table illustrating the voltage levels of associated signals of the power switch circuit of FIG. 6A.

FIG. 6A is a schematic circuit diagram illustrating a power switch circuit according to a fourth embodiment of the present invention. As shown in FIG. 6A, the power switch circuit 600 comprises two n-type transistors m1, m2, two level shifters 620, 630 and an automatic selection circuit 640. The power switch circuit 600 receives two control signals EN_m1 and EN_m2 and selectively provides a supply voltage Vp1 or a supply voltage Vp2 as an output signal Vs. The voltage levels of the control signal EN_m1 and EN_m2 in the high logic level state are 3.3V. The voltage levels of the control signal EN_m1 and EN_m2 in the low logic level state are 0V.

The automatic selection circuit 640 receives the two supply voltages Vp1 and Vp2. In addition, the supply voltage with the lower magnitude is automatically selected as an output voltage Vx by the automatic selection circuit 640. The output voltage Vx is used as a voltage source of the level shifters 620 and 630. The circuitry of the automatic selection circuit 640 is identical to the circuitry of the automatic selection circuit of FIG. 2A.

The level shifter 620 receives a control signal EN_m1. According to the voltage source Vx and the control signal EN_m1, the level shifter 620 is capable of shifting down the control signal EN_m1 to a shifted signal S1. For example, if the control signal EN_m1 is in the high logic level state (e.g., 3.3V), the voltage level of the shifted signal S1 from the level shifter 620 is maintained at 3.3V. Whereas, if the control signal EN_m1 is in the low logic level state (e.g., 0V), the voltage level of the shifted signal S1 from the level shifter 620 is shifted to the voltage level of the voltage source Vx.

The level shifter 630 receives a control signal EN_m2. According to the voltage source Vx and the control signal EN_m2, the level shifter 630 is capable of shifting down the control signal EN_m2 to a shifted signal S2. For example, if the control signal EN_m2 is in the high logic level state (e.g., 3.3V), the voltage level of the shifted signal S2 from the level shifter 630 is maintained at 3.3V. Whereas, if the control signal EN_m2 is in the low logic level state (e.g., 0V), the voltage level of the shifted signal S2 from the level shifter 630 is shifted to the voltage level of the voltage source Vx.

A first source/drain terminal of the transistor m1 receives the supply voltage Vp1. A second source/drain terminal of the transistor m1 is connected with a node w. A gate terminal of the transistor m1 receives the shifted signal S1. A first source/drain terminal of the transistor m2 receives the supply voltage Vp2. A second source/drain terminal of the transistor m2 is connected with the node w. A gate terminal of the transistor m2 receives the shifted signal S2. An output signal Vs is outputted from the node w. In an embodiment of the invention, the body terminals of both m1 and m2 are connected to the voltage source Vx.

In this embodiment, the magnitudes of the supply voltages Vp1 and Vp2 are lower than or equal to 0V. FIG. 6B is a truth table illustrating the voltage levels of associated signals of the power switch circuit of FIG. 6A. If the magnitude of the supply voltage Vp1 is lower than the magnitude of the supply voltage Vp2, the supply voltage Vp1 is automatically selected as the output voltage Vx by the automatic selection circuit 640. For example, if the supply voltage Vp1 is −4V and the supply voltage Vp2 is 0V, the output voltage Vx from the automatic selection circuit 640 is −4V. Moreover, according to different operation modes of the non-volatile cell array, such as an erase mode, the control signal EN_m1 is in the high logic level state (Hi=3.3V) and the control signal EN_m2 is in the low logic level state (Lo=0V), the shifted signal S1 is 3.3V and the shifted signal S2 is −4V. Consequently, the transistor m1 is turned on and the transistor m2 is turned off. Under this circumstance, the supply voltage Vp1 is selected as the output signal Vs by the power switch circuit 600. That is, the output signal Vs is equal to −4V.

On the other hand, if the non-volatile cell array is operated at another mode, such as a read mode, the control signal EN_m1 is in the low logic level state (Lo=0V) and the control signal EN_m2 is in the high logic level state (Hi=3.3V), the shifted signal S1 is −4V and the shifted signal S2 is 3.3V. Consequently, the transistor m1 is turned off and the transistor m2 is turned on. Under this circumstance, the supply voltage Vp2 is selected as the output signal Vs by the power switch circuit 600. That is, the output signal Vs is equal to 0V.

If the magnitude of the supply voltage Vp1 is higher than the magnitude of the supply voltage Vp2, the supply voltage Vp2 is automatically selected as the output voltage Vx by the automatic selection circuit 640. In some application, one of Vp1 and Vp2 is provided by internal pumping circuit, the other one is forced externally, for example, the supply voltage Vp1 is −4V and the supply voltage Vp2 is −6V, the output voltage Vx from the automatic selection circuit 640 is −6V. Moreover, if the control signal EN_m1 is in the high logic level state (Hi=3.3V) and the control signal EN_m2 is in the low logic level state (Lo=0V), the shifted signal S1 is 3.3V and the shifted signal S2 is −6V. Consequently, the transistor m1 is turned on and the transistor m2 is turned off. Under this circumstance, the supply voltage Vp1 is selected as the output signal Vs by the power switch circuit 600. That is, the output signal Vs is equal to −4V.

On the other hand, if the control signal EN_m1 is in the low logic level state (Lo=0V) and the control signal EN_m2 is in the high logic level state (Hi=3.3V), the shifted signal S1 is −6V and the shifted signal S2 is 3.3V. Consequently, the transistor m1 is turned off and the transistor m2 is turned on. Under this circumstance, the supply voltage Vp2 is selected as the output signal Vs by the power switch circuit 600. That is, the output signal Vs is equal to −6V.

Figure 7:
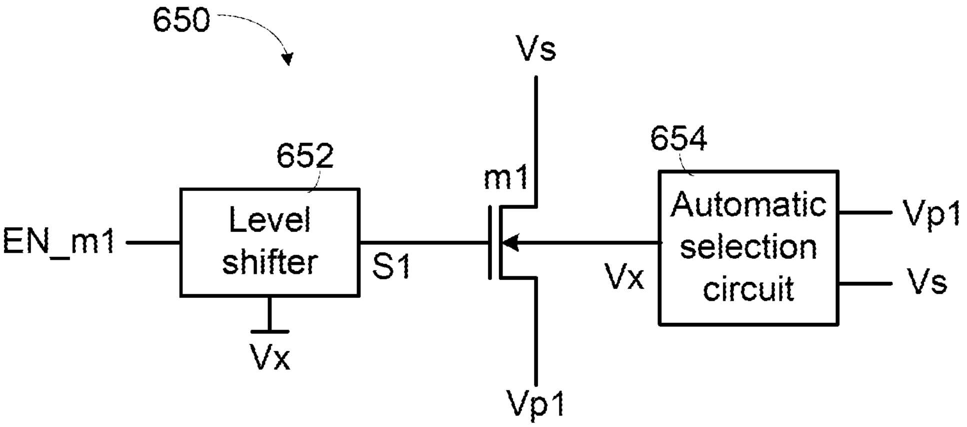
FIG. 7 is a schematic circuit diagram illustrating a power switch circuit according to a fifth embodiment of the present invention.

FIG. 7 is a schematic circuit diagram illustrating a power switch circuit according to a fifth embodiment of the present invention. As shown in FIG. 7, the power switch circuit 650 comprises an n-type transistor m1, a level shifter 652 and an automatic selection circuit 654. The power switch circuit 650 receives a control signal EN_m1 and selectively provides a supply voltage Vp1 as an output signal Vs. The voltage level of the control signal EN_m1 in the high logic level state is 3.3V. The voltage level of the control signal EN_m1 in the low logic level state is 0V.

In this embodiment, the automatic selection circuit 654 receives the supply voltage Vp1 and the output signal Vs. Moreover, one of the supply voltage Vp1 and the output signal Vs with the lower magnitude is transmitted to a body terminal of the transistor m1 by the automatic selection circuit 654 and used as a body voltage Vx of the transistor m1. Furthermore, the output voltage Vx of the automatic selection circuit 654 is used as a voltage source of the level shifter 652. The circuitry of the automatic selection circuit 654 is identical to the circuitry of the automatic selection circuit of FIG. 2A.

In this embodiment, the automatic selection circuit 654 receives the supply voltage Vp1 and the output signal Vs. Moreover, one of the supply voltage Vp1 and the output signal Vs with the lower magnitude is transmitted to a body terminal of the transistor m1 by the automatic selection circuit 654 and used as a body voltage Vx of the transistor m1. Consequently, the body effect of the transistor m1 can be eliminated.

Figure 8:
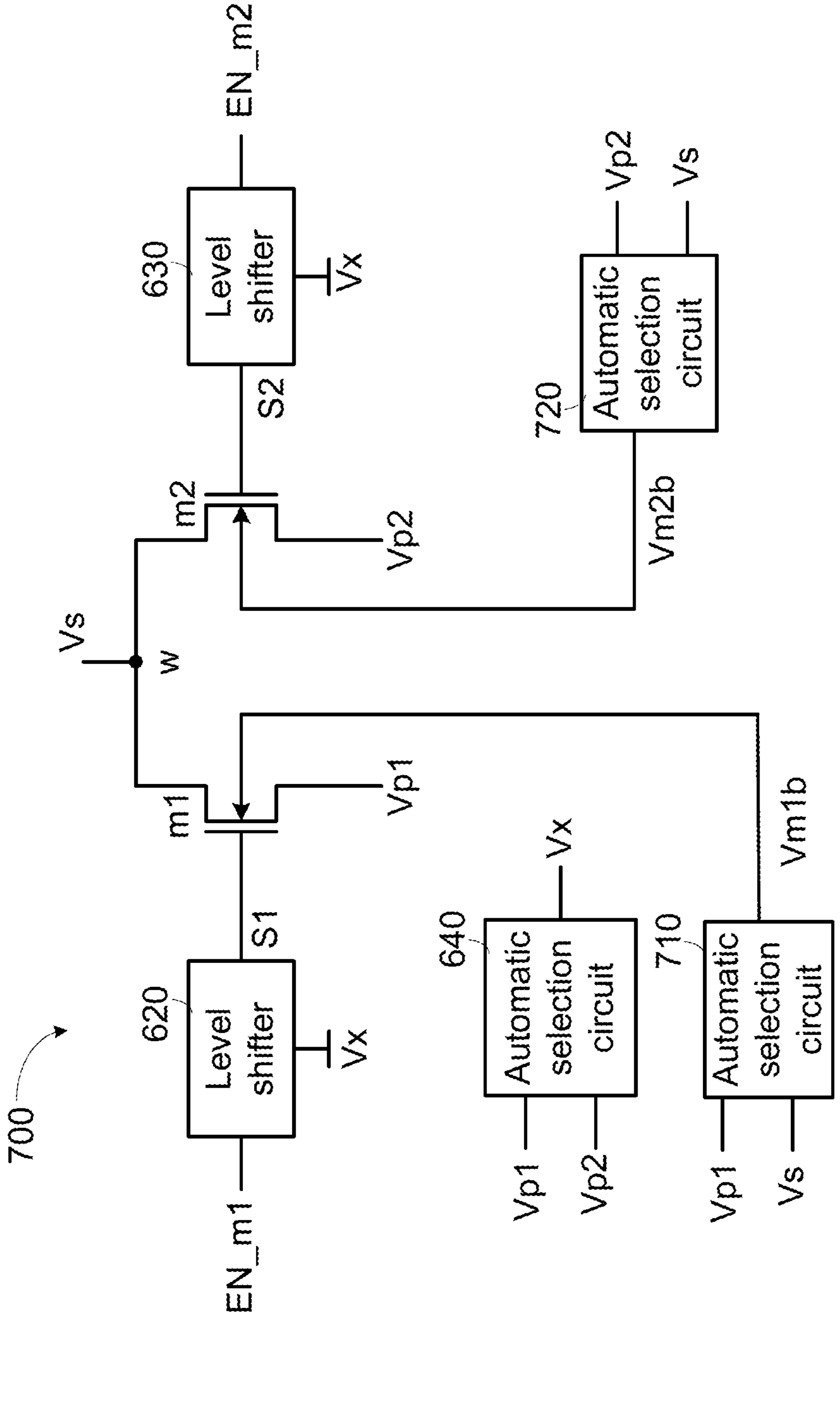
FIG. 8 is a schematic circuit diagram illustrating a power switch circuit according to a sixth embodiment of the present invention.

FIG. 8 is a schematic circuit diagram illustrating a power switch circuit according to a sixth embodiment of the present invention. In comparison with the power switch circuit 600 of FIG. 6A, the power switch circuit 700 of this embodiment further comprises two automatic selection circuits 710 and 720. The circuitry of the automatic selection circuit 710 and the circuitry of the automatic selection circuit 720 are identical to the circuitry of the automatic selection circuit of FIG. 2A. Hereinafter, only the operations of the automatic selection circuits 710 and 720 will be described.

In this embodiment, the automatic selection circuit 710 receives the supply voltage Vp1 and the output signal Vs. Moreover, one of the supply voltage Vp1 and the output signal Vs with the lower magnitude is transmitted to a body terminal of the transistor m1 by the automatic selection circuit 710 and used as a body voltage Vm1*b* of the transistor m1. The automatic selection circuit 720 receives the supply voltage Vp2 and the output signal Vs. Moreover, one of the supply voltage Vp2 and the output signal Vs with the lower magnitude is transmitted to a body terminal of the transistor m2 by the automatic selection circuit 720 and used as a body voltage Vm2*b* of the transistor m2. Consequently, the body effects of the transistors m1 and m2 can be eliminated.

The truth table of the power switch circuit 700 is similar to that of FIG. 6B, and is not redundantly described herein.

Figure 9:
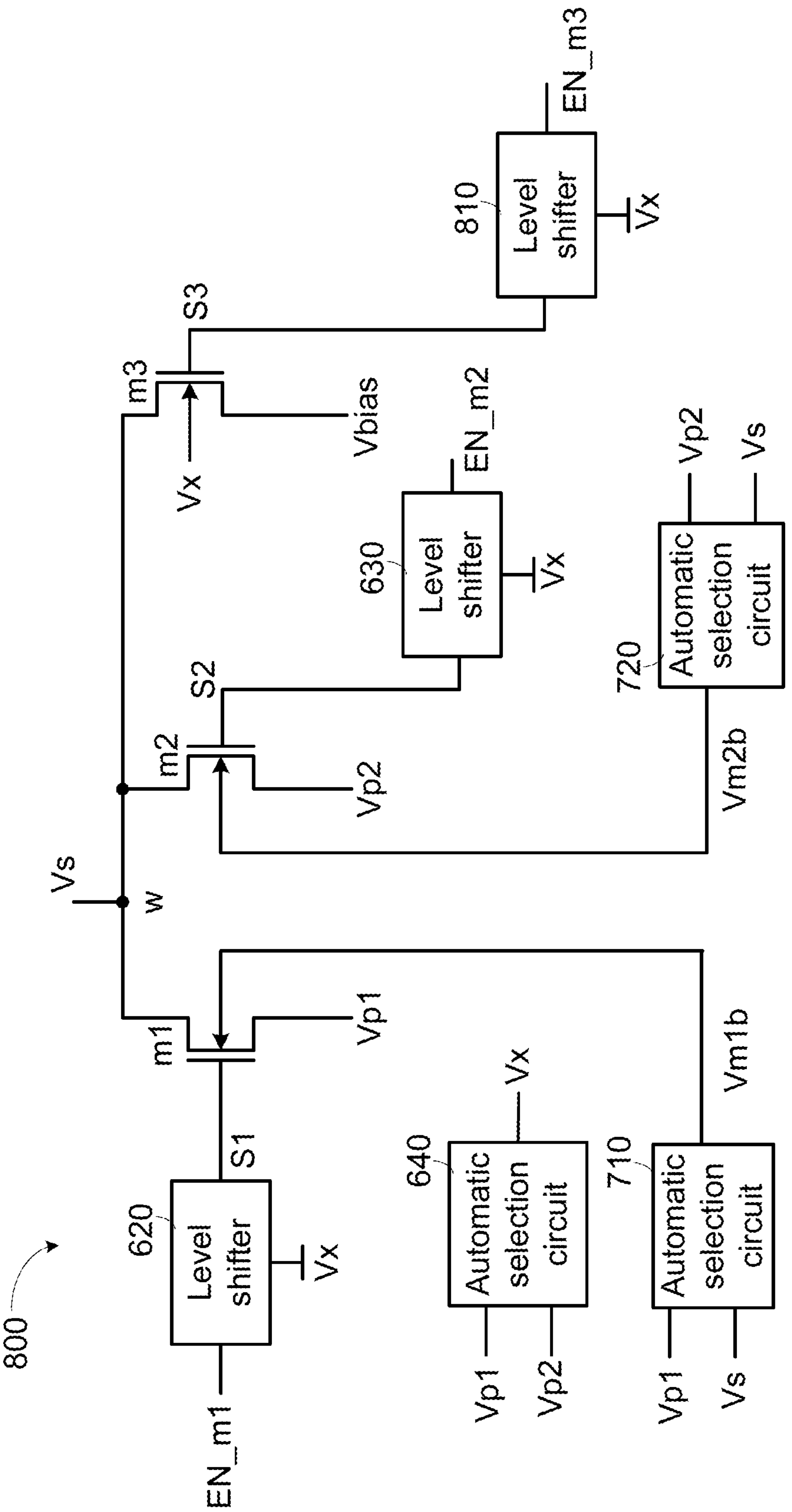
FIG. 9 is a schematic circuit diagram illustrating a power switch circuit according to a seventh embodiment of the present invention.

FIG. 9 is a schematic circuit diagram illustrating a power switch circuit according to a seventh embodiment of the present invention. In comparison with the power switch circuit 700 of FIG. 8, the power switch circuit 800 of this embodiment further comprises an n-type transistor m3 and a level shifter 810. The power switch circuit 800 of this embodiment is used for preventing the node w from being in the floating state when the control signals EN_m1 and EN_m2 are both in the low logic level state.

The level shifter 810 receives a control signal EN_m3. According to the voltage source Vx, the level shifter 810 is capable of shifting down the control signal EN_m3 to a shifted signal S3. For example, if the control signal EN_m3 is in the high logic level state (e.g., 3.3V), the voltage level of the shifted signal S3 from the level shifter 810 is maintain at 3.3V. Whereas, if the control signal EN_m3 is in the low logic level state (e.g., 0V), the voltage level of the shifted signal S3 from the level shifter 810 is shifted to the voltage level of the voltage source Vx.

A first source/drain terminal of the transistor m3 is connected with a bias voltage Vbias. A second source/drain terminal of the transistor m3 is connected with the node w. A gate terminal of the transistor m3 receives the shifted signal S3. A body terminal of the transistor m3 receives the output voltage Vx from the automatic selection circuit 640.

When the control signals EN_m1 and EN_m2 are in the low logic level state, the control signal EN_m3 is in the high logic level state. Consequently, when the control signals EN_m1 and EN_m2 are both in the low logic level state and the transistors m1 and m2 are both turned off, the transistor m3 is turned on in response to the shifted signal S3. Under this circumstance, the voltage of the node w is maintained at the bias voltage Vbias, and the node w is not in the floating state. Moreover, the bias voltage Vbias is equal to one of the two supply voltages Vp1 and Vp2.

Figure 10:
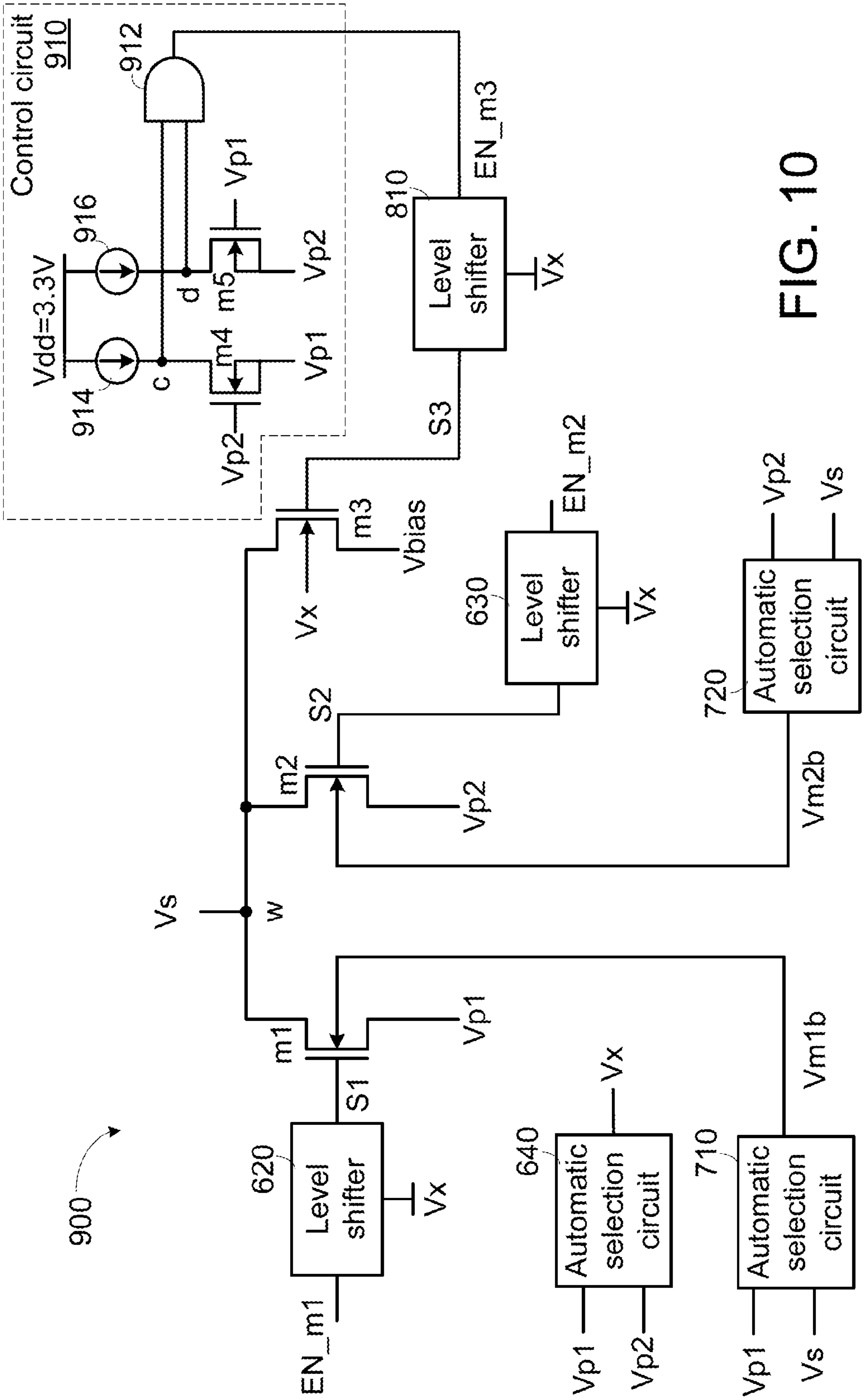
FIG. 10 is a schematic circuit diagram illustrating a power switch circuit according to an eighth embodiment of the present invention.

FIG. 10 is a schematic circuit diagram illustrating a power switch circuit according to an eighth embodiment of the present invention. In comparison with the power switch circuit 800 of FIG. 9, the power switch circuit 900 of this embodiment further comprises a control circuit 910 for generating the control signal EN_m3.

As shown in FIG. 10, the control circuit 910 comprises transistors m4, m5, current sources 914, 916 and an AND gate 912. The current source 914 is connected between a voltage source Vdd and a node c. A first source/drain terminal and a body terminal of the transistor m4 receive the supply voltage Vp1. A second source/drain terminal of the transistor m4 is connected with the node c. A gate terminal of the transistor m4 receives the supply voltage Vp2. The current source 916 is connected between the voltage source Vdd and a node d. A first source/drain terminal and a body terminal of the transistor m5 receive the supply voltage Vp2. A second source/drain terminal of the transistor m5 is connected with the node d. A gate terminal of the transistor m5 receives the supply voltage Vp1. The two input terminals of the AND gate 912 are connected with the nodes c and d, respectively. The output terminal of the AND gate 912 generates the control signal EN_m3. In an embodiment, the voltage of the voltage source Vdd is 3.3V.

If the supply voltages Vp1 and Vp2 are identical and the control signals EN_m1 and EN_m2 are both in the low logic level state, both of the transistors m1 and m2 are turned off. For example, if the supply voltage Vp1 is 0V and the supply voltage Vp2 is 0V, both of the transistors m4 and m5 are turned off. Consequently, the node c and the node d are in the high logic level state, and the control signal EN_m3 from the AND gate 912 is in the high logic level state.

When the control signal EN_m3 is in the high logic level state, the transistor m3 is turned on in response to the shifted signal S3. Under this circumstance, the voltage of the node w is maintained at the bias voltage Vbias, and the node w is not in the floating state. Moreover, the bias voltage Vbias is equal to one of the two supply voltages Vp1 and Vp2.

Figure 11:
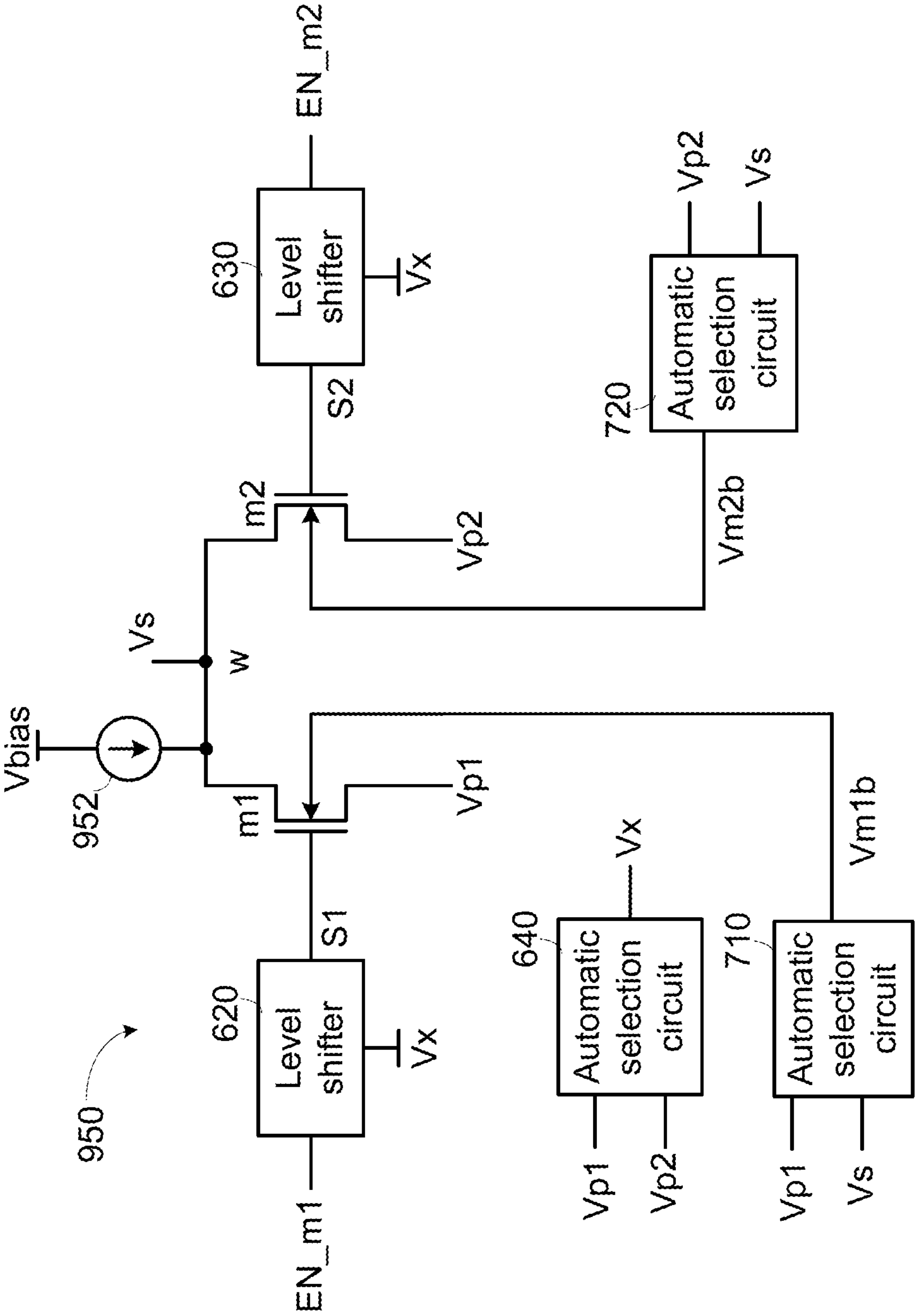
FIG. 11 is a schematic circuit diagram illustrating a power switch circuit according to a ninth embodiment of the present invention.

FIG. 11 is a schematic circuit diagram illustrating a power switch circuit according to a ninth embodiment of the present invention. In comparison with the power switch circuit 700 of FIG. 8, the power switch circuit 950 of this embodiment further comprises a weak current source 952. The power switch circuit 950 of this embodiment is used for preventing the node w from being in the floating state when the control signals EN_m1 and EN_m2 are both in the low logic level state.

The weak current source 952 is connected between a bias voltage Vbias and the node w. When the control signals EN_m1 and EN_m2 are both in the low logic level state and the transistors m1 and m2 are turned off, the weak current provided by the weak current source 952 charges the node w. Consequently, the voltage of the node w is maintained at the bias voltage Vbias, and the node w is not in the floating state. Moreover, the bias voltage Vbias is equal to one of the two supply voltages Vp1 and Vp2.

From the above descriptions, the present invention provides a power switch circuit. In the first, second and third embodiments, the power switch circuit is capable of automatically selecting the supply voltage with the lower magnitude as the output signal and preventing the output signal from being in the floating state. In the fourth, fifth, sixth, seventh and eighth embodiments, the power switch circuit is capable of selecting one supply voltage as the output signal according to the control signal and preventing the output signal from being in the floating state.

Furthermore, those skilled in the art will readily observe that numerous modifications and alterations may be made while retaining the teachings of the invention. For example, the automatic selection circuit 710 and the circuitry of the automatic selection circuit 720 are not used in one of the sixth embodiment, the seventh embodiment and the eight embodiment.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A power switch circuit, comprising:

a first transistor, wherein a first source/drain terminal of the first transistor receives a first supply voltage, a second source/drain terminal of the first transistor is connected with a node z, a gate terminal of the first transistor receives a second supply voltage, a body terminal of the first transistor is connected with the node z, and an output signal is outputted from the node z;

a second transistor, wherein a first source/drain terminal of the second transistor receives the second supply voltage, a second source/drain terminal of the second transistor is connected with the node z, a gate terminal of the second transistor receives the first supply voltage, and a body terminal of the second transistor is connected with the node z;

a third transistor, wherein a first source/drain terminal of the third transistor receives a bias voltage, a second source/drain terminal of the third transistor is connected with the node z, a gate terminal of the third transistor receives a shifted signal, and a body terminal of the third transistor is connected with the node z;

an automatic selection circuit receiving the first supply voltage and the second supply voltage and generating an output voltage, wherein if the first supply voltage is lower than the second supply voltage, the first supply voltage is selected as the output voltage, wherein if the first supply voltage is higher than the second supply voltage, the second supply voltage is selected as the output voltage; and a level shifter for converting a control signal into the shifted signal according to the control signal and the output voltage of the automatic selection circuit.

2. The power switch circuit as claimed in claim 1, wherein the bias voltage is equal to the first supply voltage, or the bias voltage is equal to the second supply voltage.

3. The power switch circuit as claimed in claim 1, wherein the first transistor, the second transistor and the third transistor are n-type transistors.

4. The power switch circuit as claimed in claim 1, wherein the automatic selection circuit comprises:

a fourth transistor, wherein a first source/drain terminal of the fourth transistor receives the first supply voltage, a second source/drain terminal of the fourth transistor generates the output voltage, a gate terminal of the fourth transistor receives the second supply voltage, and a body terminal of the fourth transistor is connected with the second source/drain terminal of the fourth transistor; and a fifth transistor, wherein a first source/drain terminal of the fifth transistor receives the second supply voltage, a second source/drain terminal and a body terminal of the fifth transistor are connected with the second source/drain terminal of the fourth transistor, and a gate terminal of the fifth transistor receives the first supply voltage.

5. The power switch circuit as claimed in claim 1, further comprising:

a fourth transistor, wherein a first source/drain terminal and a body terminal of the fourth transistor receive the first supply voltage, a second source/drain terminal of the fourth transistor is connected with a node a, and a gate terminal of the fourth transistor receives the second supply voltage;

a fifth transistor, wherein a first source/drain terminal and a body terminal of the fifth transistor receive the second supply voltage, a second source/drain terminal of the fifth transistor is connected with a node b, and a gate terminal of the fifth transistor receives the first supply voltage;

a first current source connected between a voltage source and the node a;

a second current source connected between the voltage source and the node b; and an AND gate, wherein two input terminals of the AND gate are respectively connected with the node a and the node b, and an output terminal of the AND gate generates the control signal.

6. A power switch circuit, comprising:

a first transistor, wherein a first source/drain terminal of the first transistor receives a first supply voltage, a second source/drain terminal of the first transistor is connected with a node w, a gate terminal of the first transistor receives a first shifted signal, and an output signal is outputted from the node w;

a second transistor, wherein a first source/drain terminal of the second transistor receives the second supply voltage, a second source/drain terminal of the second transistor is connected with the node w, and a gate terminal of the second transistor receives a second shifted signal;

a first automatic selection circuit receiving the first supply voltage and the second supply voltage and generating an output voltage, wherein if the first supply voltage is lower than the second supply voltage, the first supply voltage is selected as the output voltage, wherein if the first supply voltage is higher than the second supply voltage, the second supply voltage is selected as the output voltage;

a first level shifter for converting a first control signal into the first shifted signal according to the first control signal and the output voltage of the first automatic selection circuit; and a second level shifter for converting a second control signal into the second shifted signal according to the second control signal and the output voltage of the first automatic selection circuit.

7. The power switch circuit as claimed in claim 6, wherein the first transistor and the second transistor are n-type transistors.

8. The power switch circuit as claimed in claim 6, wherein the first automatic selection circuit comprises:

a third transistor, wherein a first source/drain terminal of the third transistor receives the first supply voltage, a second source/drain terminal of the third transistor generates the output voltage, a gate terminal of the third transistor receives the second supply voltage, and a body terminal of the third transistor is connected with the second source/drain terminal of the third transistor; and a fourth transistor, wherein a first source/drain terminal of the fourth transistor receives the second supply voltage, a second source/drain terminal and a body terminal of the fourth transistor are connected with the second source/drain terminal of the third transistor, and a gate terminal of the fourth transistor receives the first supply voltage.

9. The power switch circuit as claimed in claim 6, further comprising:

a second automatic selection circuit receiving the first supply voltage and the output signal and generating a first body voltage to a body terminal of the first transistor, wherein if the first supply voltage is lower than the output signal, the first supply voltage is selected as the first body voltage, wherein if the first supply voltage is higher than the output signal, the output signal is selected as the first body voltage; and a third automatic selection circuit receiving the second supply voltage and the output signal and generating a second body voltage to a body terminal of the second transistor, wherein if the second supply voltage is lower than the output signal, the second supply voltage is selected as the second body voltage, wherein if the second supply voltage is higher than the output signal, the output signal is selected as the second body voltage.

10. The power switch circuit as claimed in claim 6, further comprising:

a third transistor, wherein a first source/drain terminal of the third transistor receives a bias voltage, a second source/drain terminal of the third transistor is connected with the node w, and a gate terminal of the third transistor receives a third shifted signal; and a third level shifter for converting a third control signal into the third shifted signal according to the third control signal and the output voltage, wherein when the first control signal and the second control signal are in a first logic level state, the third control signal is in a second logic level state.

11. The power switch circuit as claimed in claim 10, wherein the bias voltage is equal to the first supply voltage, or the bias voltage is equal to the second supply voltage.

12. The power switch circuit as claimed in claim 10, further comprising:

a fourth transistor, wherein a first source/drain terminal and a body terminal of the fourth transistor receive the first supply voltage, a second source/drain terminal of the fourth transistor is connected with a node c, and a gate terminal of the fourth transistor receives the second supply voltage;

a fifth transistor, wherein a first source/drain terminal and a body terminal of the fifth transistor receive the second supply voltage, a second source/drain terminal of the fifth transistor is connected with a node d, and a gate terminal of the fifth transistor receives the first supply voltage;

a first current source connected between a voltage source and the node c;

a second current source connected between the voltage source and the node d; and an AND gate, wherein two input terminals of the AND gate are respectively connected with the node c and the node d, and an output terminal of the AND gate generates the third control signal.

13. The power switch circuit as claimed in claim 6, further comprising a weak current source, wherein the weak current source is connected between a bias voltage and the node w.

14. The power switch circuit as claimed in claim 13, wherein the bias voltage is equal to the first supply voltage, or the bias voltage is equal to the second supply voltage.

* * * * *